US008305248B2

(12) United States Patent
Lee et al.

(10) Patent No.: US 8,305,248 B2
(45) Date of Patent: Nov. 6, 2012

(54) SUB-EXPONENT TIME-TO-DIGITAL CONVERTER USING PHASE-DIFFERENCE ENHANCEMENT DEVICE

(75) Inventors: Seon Kyoo Lee, Pohang-si (KR); Jae Yoon Sim, Pohang-si (KR)

(73) Assignee: Postech Academy-Industry Foundation, Pohang-Si (KR)

( * ) Notice: Subject to any disclaimer, the term of this patent is extended or adjusted under 35 U.S.C. 154(b) by 113 days.

(21) Appl. No.: 12/795,221

(22) Filed: Jun. 7, 2010

(65) Prior Publication Data

US 2011/0279299 A1 Nov. 17, 2011

(30) Foreign Application Priority Data

May 13, 2010 (KR) ........................ 10-2010-0044818

(51) Int. Cl.
*H03M 1/50* (2006.01)

(52) U.S. Cl. ....................................... 341/166; 341/155

(58) Field of Classification Search .................. 341/166, 341/141, 155, 157; 327/3, 5, 288, 158, 159, 327/149, 182, 269

See application file for complete search history.

(56) References Cited

U.S. PATENT DOCUMENTS 6,525,585 B1 * 2/2003 Iida et al. ..................... 327/279

OTHER PUBLICATIONS

Seon-Kyoo Lee et al., "A 1GHz ADPLL with a 1.25ps Minimum-Resolution Sub-Exponent TDC in 0.18 μm CMOS", Digest of Technical Papers of the 2010 IEEE International Solid-State Circuits Conference, pp. 482-484 & 466-467 (Feb. 2010).

* cited by examiner

*Primary Examiner* — Joseph Lauture

(74) *Attorney, Agent, or Firm* — Kile Park Goekjian Reed & McManus PLLC

(57) ABSTRACT

A time-to-digital converter includes a phase-difference enhancement section configured to receive first and second input signals having a reference phase difference Δt, and to output first and second output signals having an enhanced phase difference; and a comparison section configured to receive the first and second output signals, to compare a phase difference between the first and second output signals with a reference delay time τ, and to output a comparison signal. The time-to-digital converter has a high resolution. That is to say, the time-to-digital converter has a resolution less than the minimum phase delay time of a delay element, which is obtainable in a corresponding semiconductor process.

7 Claims, 5 Drawing Sheets

FIG. 7

| Input Phase-difference (Δt), τ =64ps | Output (binary) | Output (decimal) |
|---|---|---|
| $\Delta t < 2^{-5}\tau$ | 00000 | 0 |
| $2^{-5}\tau < \Delta t < 2^{-4}\tau$ | 00001 | 1 |
| $2^{-4}\tau < \Delta t < 2^{-3}\tau$ | 00010 | 2 |
| $2^{-3}\tau < \Delta t < 2^{-2}\tau$ | 00100 | 4 |
| $2^{-2}\tau < \Delta t < 2^{-1}\tau$ | 01000 | 8 |
| $\Delta t > 2^{-1}\tau$ | 10000 | 16 |

SUB-EXPONENT TIME-TO-DIGITAL CONVERTER USING PHASE-DIFFERENCE ENHANCEMENT DEVICE

BACKGROUND OF THE INVENTION

1. Field of the Invention

The present invention relates to a time-to-digital converter, and more particularly, to a sub-exponent time-to-digital converter using a phase-difference enhancement device.

2. Description of the Related Art

In general, a time-to-digital converter is used in almost all digitally-controlled phase-locked loops (PLLs). In addition, the time-to-digital converter also used as a means for measuring a very short time interval, and is utilized in very various fields. However, the time-to-digital converter is required to have a high resolution in order to minimize a quantization error.

FIG. 1 is a circuit diagram of a conventional time-to-digital converter.

Referring to FIG. 1, the conventional time-to-digital converter 100 includes a delay signal generation section 110 and a digital signal generation section 120.

The delay signal generation section 110 is constituted with a plurality of delay elements D1 to D3, which are coupled in series with each other and are configured to gradually delay the phase of a first input signal and to generate a plurality of phase-delayed signals delay1 to delay3. The delay elements generally are constructed with inverters capable of implementing a shortest delay time in a semiconductor process.

The digital signal generation section 120 is constituted with a plurality of D flip-flops D-FF1 to D-FF3, which latches the phase-delayed signals delay1 to delay3 to generate a plurality of output signal Q1 to Q3 in response to a second input signal.

In this case, when it is assumed that the time-to-digital converter receives first and second input signals having a reference phase difference Δt between the input signals, and all the delay elements cause the same delay time τ, the conventional time-to-digital converter operates as follows.

The delay signal generation section 110 receives the first input signal, and generates a plurality of delay signals delay1 to delay3 having mutually different delay times through the plurality of delay elements. In this case, as the first input signal passes through the delay elements one after another, the first input signal is delayed longer and longer.

The digital signal generation section 120 receives the plurality of delay signals, and generates digital signals corresponding to the phase difference Δt. That is, the D flip-flops D-FF1 to D-FF3 of the digital signal generation section 120 latch the delay signals to generate output signals Q1 to Q3, respectively, in response to the second input signal, wherein, if the first input signal is delayed greater than the reference phase difference Δt, a corresponding D flip-flop generates an output signal of "0," and if not, a corresponding D flip-flop generates an output signal of "1."

Therefore, through the examination of the outputs of the D flip-flops, it is possible to find the phase difference between the first and second input signals. That is, when N number of D flip-flops generate an output signal of "1," the phase difference between the first and second input signals is calculated by "N*τ."

In this case, τ designates a minimum delay time into which the time-to-digital converter can resolve a time. That is, when the phase difference between two input signals is equal to or less than τ, it is impossible to perform conversion into a corresponding digital signal. In this case, there is a disadvantage in that τ is determined according to semiconductor processes. As described above, the conventional time-to-digital converter has a limitation in the minimum delay time which can be obtained in a semiconductor process, and requires high power consumption and a wide area on a semiconductor chip due to a large number of D flip-flop and serially-coupled delay elements.

SUMMARY OF THE INVENTION

Accordingly, the present invention has been made in an effort to solve the problems occurring in the related art, and an object of the present invention is to provide a sub-exponent time-to-digital converter using a phase-difference enhancement device, which has a resolution less than the minimum phase delay time of a delay element that can be obtained in a corresponding semiconductor process.

In order to achieve the above object, according to one aspect of the present invention, there is provided a time-to-digital converter including: a phase-difference enhancement section configured to receive first and second input signals having a reference phase difference Δt, and to output first and second output signals having an enhanced phase difference; and a comparison section configured to receive the first and second output signals, to compare a phase difference between the first and second output signals with a reference delay time τ, and to output a comparison signal.

BRIEF DESCRIPTION OF THE DRAWINGS

The above objects, and other features and advantages of the present invention will become more apparent after a reading of the following detailed description taken in conjunction with the drawings, in which:

FIG. 7 is a view showing outputs corresponding to the phase differences between input signals in the sub-exponent time-to-digital converter using a phase-difference enhancement device according to an embodiment of the present invention.

DETAILED DESCRIPTION OF PREFERRED EMBODIMENTS

Figure 1:
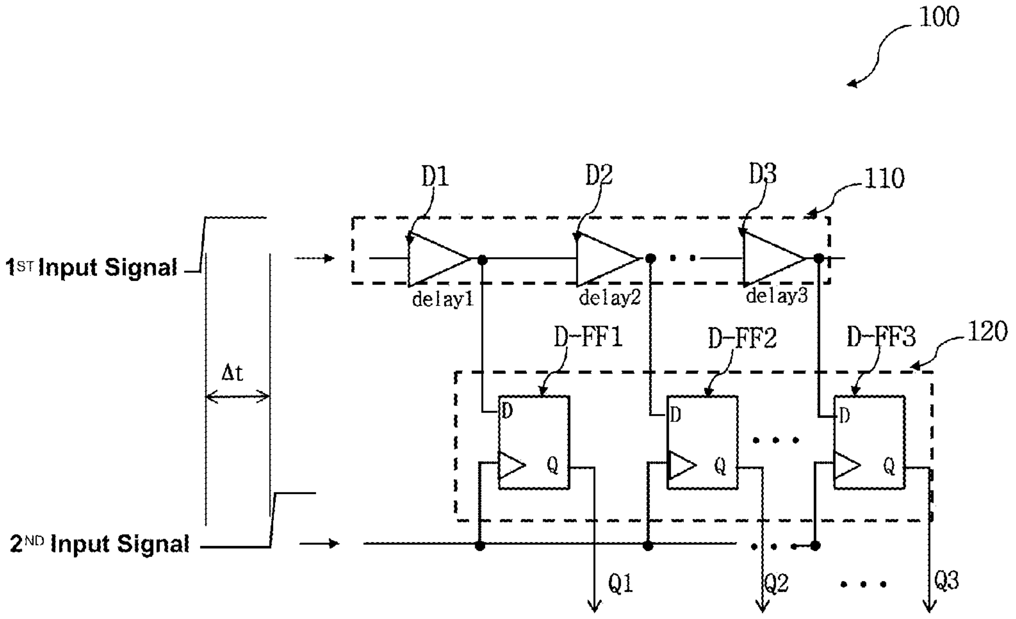
FIG. 1 (PRIOR ART)
FIG. 1 is a circuit diagram of a conventional time-to-digital converter.

Reference will now be made in greater detail to preferred embodiments of the invention, examples of which are illustrated in the accompanying drawings. Wherever possible, the same reference numerals will be used throughout the drawings and the description to refer to the same or like parts.

Figure 2:
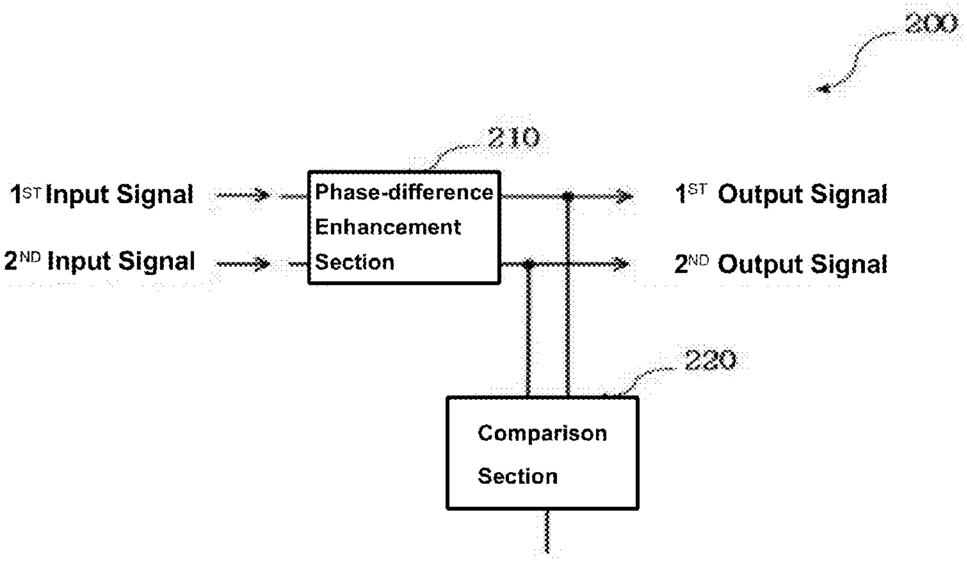
FIG. 2 is a block diagram illustrating the configuration of a sub-exponent time-to-digital converter using a phase-difference enhancement device according to an embodiment of the present invention.

FIG. 2 is a block diagram illustrating the configuration of a sub-exponent time-to-digital converter using a phase-difference enhancement device according to an embodiment of the present invention.

Referring to FIG. 2, the sub-exponent time-to-digital converter using a phase-difference enhancement device includes a phase-difference enhancement section 210 and a comparison section 220.

The phase-difference enhancement section 210 receives first and second input signals having a reference phase difference Δt, enhances the reference phase difference Δt, and generates first and second output signals.

The comparison section 220 receives the first and second output signals obtained by enhancing the reference phase difference Δt, compares the enhanced phase difference with a reference delay time τ, and generates a comparison signal. That is, the comparison section 220 generates a comparison signal corresponding to the amplitude of the first reference phase difference Δt.

Figure 3:
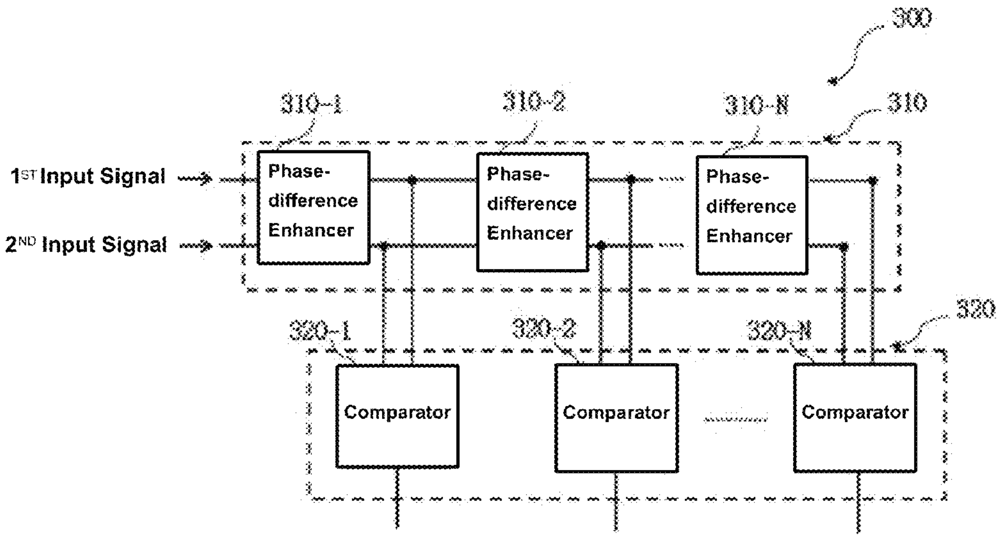
FIG. 3 is a block diagram illustrating the internal configuration of a phase-difference enhancement section and a comparison section in the sub-exponent time-to-digital converter using a phase-difference enhancement device according to an embodiment of the present invention.

FIG. 3 is a block diagram illustrating the internal configuration of the phase-difference enhancement section 310 and the comparison section 320 in the sub-exponent time-to-digital converter using a phase-difference enhancement device according to an embodiment of the present invention.

Referring to FIG. 3, the phase-difference enhancement section 310 is constituted with first to $N^{th}$ phase-difference enhancers 310-1 to 310-N (wherein, N represents a natural number equal to or greater than 2), which are coupled in series with each other and are configured to enhance the phase difference between first and second input signals.

Specifically, the first phase-difference enhancer receives the first and second input signals and generates first and second output signals having an enhanced phase difference. The $N^{th}$ phase-difference enhancer receives first and second output signals of the $(N-1)^{th}$ phase-difference enhancer and generates first and second output signals having an enhanced phase difference.

The comparison section 320 is constituted with first to $N^{th}$ comparators 320-1 to 320-N, which are configured to receive the first and second output signals, to compare the phase differences between the first and second output signals with a reference delay time τ, and to output comparison signals.

Specifically, the first comparator receives the first and second output signals, compares the phase difference between first and second output signals with the reference delay time τ, and outputs a first comparison signal. The $N^{th}$ comparator receives the first and second output signals of the $(N-1)^{th}$ phase-difference enhancer, compares the phase difference between the first and second output signals with the reference delay time T, and outputs an $N^{th}$ comparison signal.

Generally, each of the first to Nth comparison signals outputs a comparison signal having a value of "1" (logical high) when the phase difference between input signals is greater than the reference delay time τ, while outputting a comparison signal having a value of "0" (logical low) when the phase difference between input signals is not greater than the reference delay time τ.

Here, when it is assumed that the sub-exponent time-to-digital converter using a phase-difference enhancement device according to an embodiment of the present invention receives first and second input signals having a predetermined reference phase difference Δt, and each phase-difference enhancer doubles a phase difference, the operation of the converter is as follows.

First, whenever two input signals pass through each phase-difference enhancer, the phase difference thereof doubles. For example, the phase difference between the output signals of the first phase-difference enhancer 310-1 becomes $2*\Delta t$, the phase difference between the output signals of the second phase-difference enhancer 310-2 becomes $2^2*\Delta t$, and finally, the phase difference between the output signals of the $N^{th}$ phase-difference enhancer 310-N becomes $2^N*\Delta t$.

Each of the first to $N^{th}$ comparators 320-1 to 320-N has two input terminals and one output terminal, wherein the two input terminals receive the first and second output signals of each corresponding phase-difference enhancer. In this case, each comparator compares the phase difference between first and second output signals of each corresponding phase-difference enhancer with a predetermined delay time τ, and generates a comparison signal. That is, the comparison section 320 outputs a comparison signal corresponding to the amplitude of the phase difference Δt of first two input signals.

Figure 4:
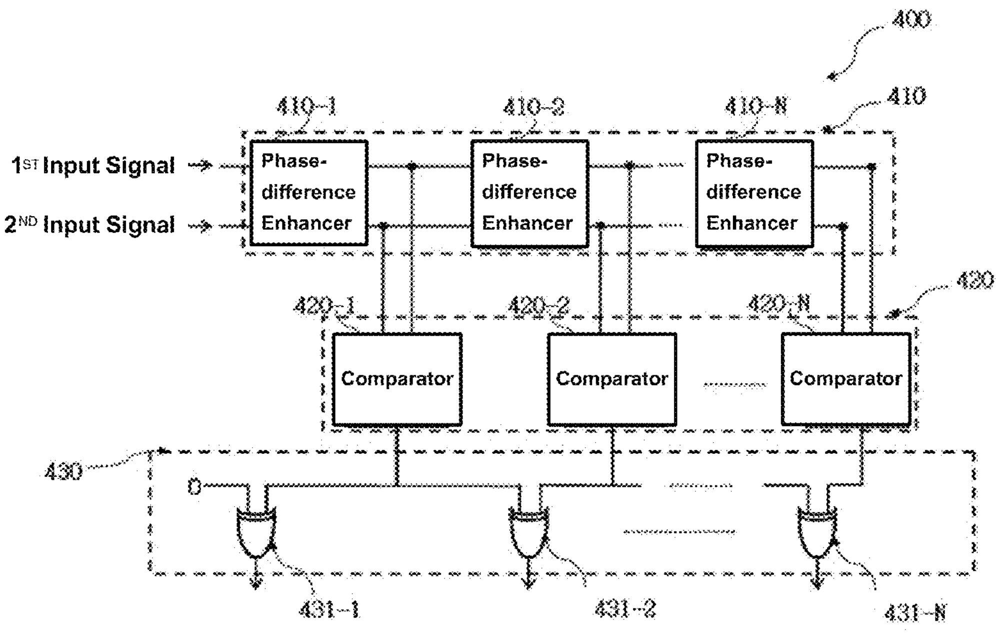
FIG. 4 is a block diagram illustrating the configuration of a sub-exponent time-to-digital converter using a phase-difference enhancement device according to another embodiment of the present invention.

FIG. 4 is a block diagram illustrating the configuration of a sub-exponent time-to-digital converter using a phase-difference enhancement device according to another embodiment of the present invention.

Referring to FIG. 4, the sub-exponent time-to-digital converter using a phase-difference enhancement device according to another embodiment of the present invention includes a phase-difference enhancement section 410, a comparison section 420, and an XOR gate section 430.

The phase-difference enhancement section 410 and the comparison section 420 have the same configuration as those described with reference to FIG. 3, so a detailed description thereof will be omitted.

The XOR gate section 430 is constituted with first to $N^{th}$ XOR gates 430-1 to 430-N. The first XOR gate 430-1 generates a digital signal obtained by performing an exclusive-OR operation on a comparison signal of the first comparator 420-1 and a value of "0" (logical low) received from the exterior. Each $N^{th}$ XOR gate, except for the first XOR gate, generates a digital signal obtained by performing an exclusive-OR operation on a comparison signal of the $(N-1)^{st}$ comparator (wherein, N represents a natural number equal to or greater than 2) and a comparison signal of the $N^{th}$ comparator.

Therefore, the XOR gate section 430 outputs a digital signal corresponding to the amplitude of the reference phase difference Δt.

Figure 5:
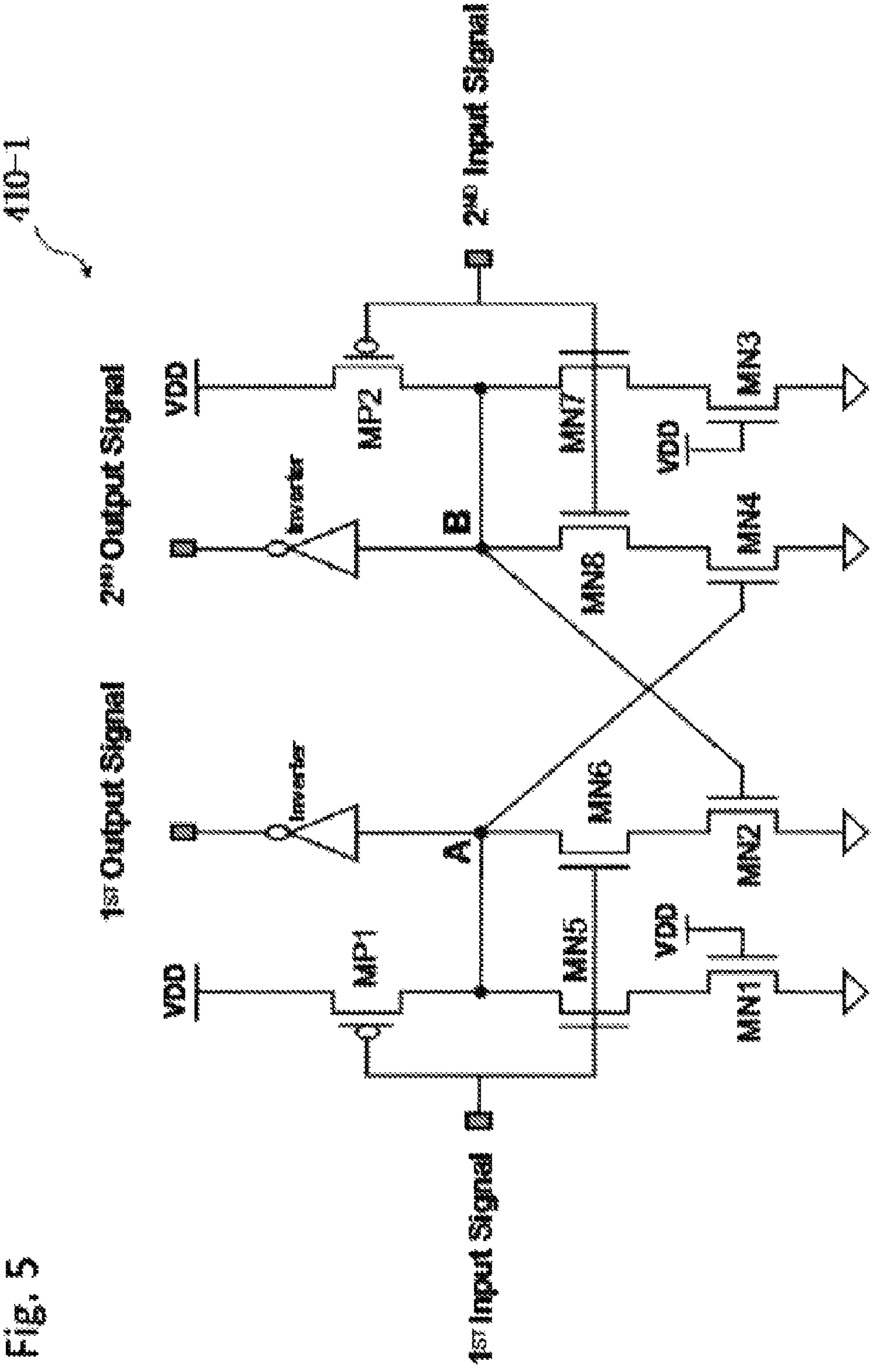
FIG. 5 is a circuit diagram view specifically illustrating the configuration of a double phase-difference enhancer in the sub-exponent time-to-digital converter using a phase-difference enhancement device according to an embodiment of the present invention.

FIG. 5 is a circuit diagram view specifically illustrating the configuration of a double phase-difference enhancer 410-1 in the sub-exponent time-to-digital converter using a phase-difference enhancement device according to an embodiment of the present invention.

Referring to FIG. 5, the double phase-difference enhancer 410-1 has two input terminals and two output terminals. The double phase-difference enhancer 410-1 receives first and second input signals having a reference phase difference Δt through the two input terminals, respectively, and generates first and second output signals having double the reference phase difference through the two output terminals, respectively.

The first input terminal is coupled to the gate terminals of NMOS transistors MN5 and MN6 and to the gate terminal of a PMOS transistor MP1, and the second input terminal is coupled to the gate terminals of NMOS transistors MN7 and MN8 and to the gate terminal of a PMOS transistor MP2.

The gate terminals of NMOS transistors MN1 and MN3 are coupled to a VDD terminal, the gate terminal of an NMOS transistor MN2 is coupled to node B, and the gate terminal of an NMOS transistor MN4 is coupled to node A. The same inverters are coupled between the first output terminal and node A and between the second output terminal and node B, respectively, so as to output the first and second output signals, respectively.

The operation of the double phase-difference enhancer will now be described with reference to FIG. 5.

Here, it is assumed that, when first both input signals of the double phase-difference enhancer have a value of "0" (logical low), nodes A and B are precharged to a voltage of VDD. Accordingly, the gate terminals of the NMOS transistors MN1 to MN4 have all been coupled to the VDD terminal, and the gate terminals of the NMOS transistors MN5 to MN8 have all been coupled to the ground (0 volt).

When it is assumed that the first input signal transitions to one (logical high) before the second input signal does, node A first starts discharging. When node A first starts discharging, the gate voltage of the NMOS transistor MN4 first drops, so that the discharging power of the NMOS transistors MN3 and MN4 constituting the discharging path of node B becomes weaker than that of the NMOS transistors MN1 and MN2 constituting the discharging path of node A.

Here, when the sizes of the NMOS transistors MN1 to MN4 determining the power thereof all are the same, node A discharges through two paths, i.e. through the NMOS transistors MN1 and MN2, while node B discharges through only one path, i.e. through the NMOS transistor MN3, so that the phase difference approximately doubles.

That is, a first-input signal of two input signals makes the change speed of the other signal low, so that the phase difference is enhanced. A difference (phase difference) between times at which nodes A and B charges becomes a phase difference between the first and second output signals.

In the sub-exponent time-to-digital converter using a phase-difference enhancement device according to an embodiment of the present invention, the first to $N^{th}$ phase-difference enhancers have the same configuration in principle, and the first to $N^{th}$ phase-difference enhancers may be implemented with various circuits by varying the number of NMOS transistors or the like, as well as with the aforementioned double phase-difference enhancers.

Figure 6:
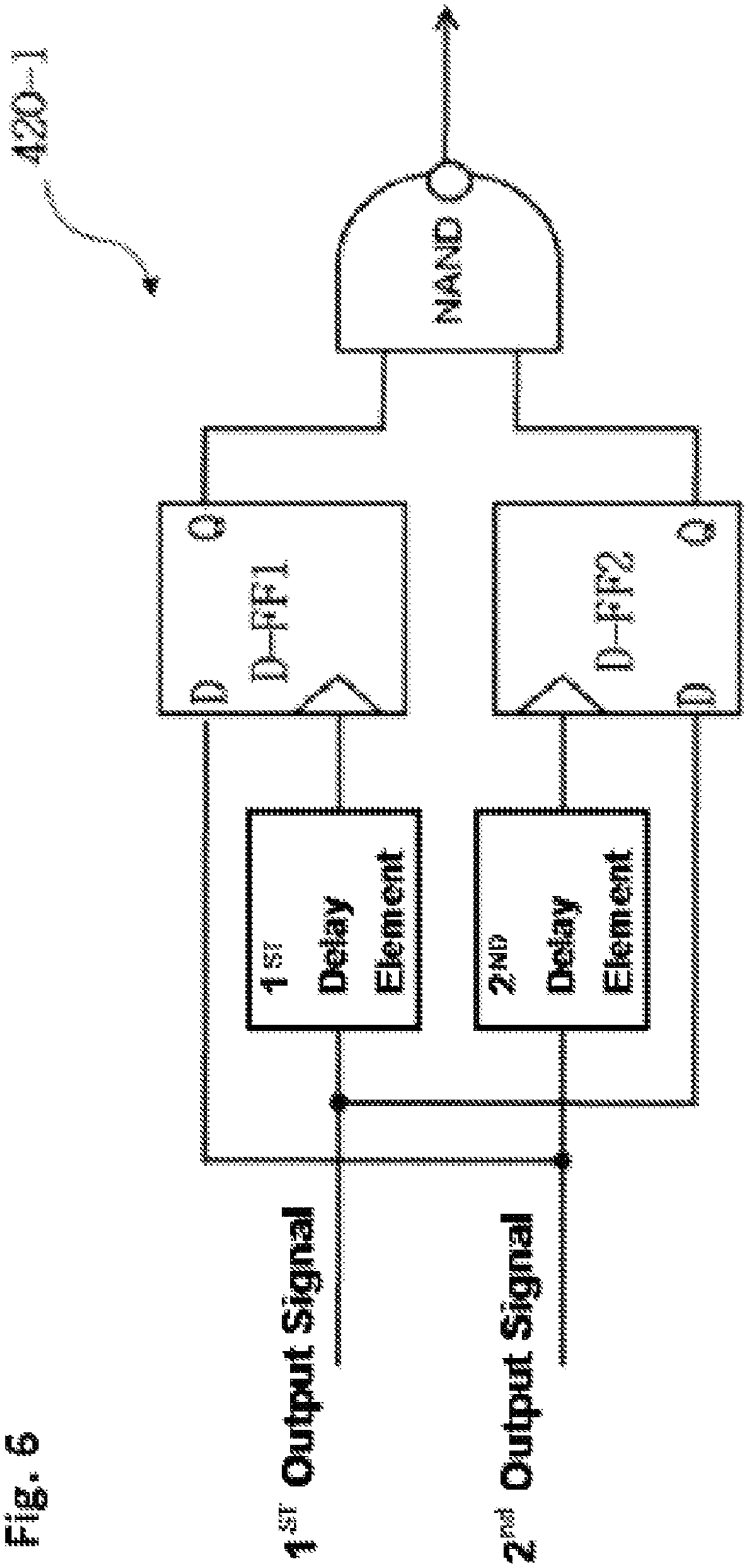
FIG. 6 is a circuit diagram view specifically illustrating the configuration of a comparator in the sub-exponent time-to-digital converter using a phase-difference enhancement device according to an embodiment of the present invention.

FIG. 6 is a circuit diagram view specifically illustrating the configuration of a comparator in the sub-exponent time-to-digital converter using a phase-difference enhancement device according to an embodiment of the present invention.

Referring to FIG. 6, a first comparator 420-1 includes a first delay element, a second delay element, a first D flip-flop, a second D flip-flop, and a NAND gate.

The first delay element receives the first output signal of the first phase-difference enhancer, and outputs a first delay signal obtained by delaying the first output signal by a predetermined delay time $\tau$. The second delay element receives the second output signal of the first phase-difference enhancer, and outputs a second delay signal obtained by delaying the second output signal by a predetermined delay time $\tau$.

The first D flip-flop receives the first delay signal, and latches and outputs the second output signal. The second D flip-flop receives the second delay signal, and latches and outputs the first output signal.

The NAND gate performs a NOT-AND operation on the output signal of the first D flip-flop and the output signal of the second D flip-flop. In this case, when the phase difference between the two output signals of the first and second D flip-flops is greater than the predetermined delay time $\tau$, the NAND gate outputs a comparison signal having a value of "1."

In the sub-exponent time-to-digital converter using a phase-difference enhancement device according to an embodiment of the present invention, the first to $N^{th}$ comparators have the same configuration in principle, and the first to $N^{th}$ comparators may be implemented with various circuits using various delay elements, flip-flops, etc., as well as with the aforementioned configuration.

FIG. 7 is a view showing output digital signals corresponding to the phase differences between input signals in the sub-exponent time-to-digital converter using a phase-difference enhancement device according to an embodiment of the present invention.

In FIG. 7, it is assumed that a first reference phase difference $\Delta t$ is 5 ps, and a phase-difference enhancement section is constituted with five phase-difference enhancers having a gain of "2." In addition, when it is assumed that a comparison section is constituted with five comparators which have the same configuration to cause the same delay time $\tau$ of 64 ps, the operation of the time-to-digital converter is as follow.

The phase difference between the output signals of a first phase-difference enhancer becomes 10 ps. The output signals are transferred to be input signals of the first comparator. In this case, since the 10 ps is less than the 64 ps which is the delay time of the first comparator, the first comparator outputs a comparison signal of "0."

Although the phase difference between the output signals of a second phase-difference enhancer is enhanced to 20 ps, it also is less than the 64 ps, so that the second comparator outputs a comparison signal of "0," as described above. Similarly, although the phase difference between the output signals of a third phase-difference enhancer is enhanced to 40 ps, it also is less than the 64 ps, so that the third comparator outputs a comparison signal of "0," as described above.

When the signals pass through a fourth phase-difference enhancer, the phase difference between the output signals of the fourth phase-difference enhancer becomes 80 ps, which is greater than the delay time 64 ps of the fourth comparator, so that the fourth comparator outputs a comparison signal of "1," and the fifth comparator also outputs a comparison signal of "1." Therefore, a comparison signal of the comparison section in response to the phase difference 5 ps of first two input signals has a value of "00011."

The output of the comparator is input to the XOR gate section, the output of the XOR gate section in response to 5 ps, which is the phase difference between the first two input signals, has a value of "00100."

Such a construction can be easily extended to have N stages, as well as the five stages, the minim resolution is enhanced in proportion to the number of phase-difference enhancers.

As is apparent from the above description, the present invention provides a sub-exponent time-to-digital converter using a phase-difference enhancement device, which does not need a large number of D flip-flops and serially-coupled delay elements, differently from the conventional time-to-digital converter. Therefore, the time-to-digital converter according to an embodiment of the present invention has advantages in that it is possible to efficiently construct a circuit, and it is possible to achieve low power consumption and a high transition speed, so that it is possible to achieve an ultra high resolution.

Although preferred embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A time-to-digital converter comprising:

a phase-difference enhancement section configured to receive first and second input signals having a reference phase difference Δt, and to output first and second output signals having an enhanced phase difference; and a comparison section configured to receive the first and second output signals, to compare a phase difference between the first and second output signals with a reference delay time τ, and to output a comparison signal, wherein the phase-difference enhancement section comprises first to $N^{th}$ phase-difference enhancers (wherein, "N" represents a natural number equal to or greater than 2), which are coupled in series with each other, wherein the first phase-difference enhancer receives the first and second input signals and generates first and second output signals having an enhanced phase difference, and the $N^{th}$ phase-difference enhancer receives first and second output signals of $(N-1)^{th}$ phase-difference enhancer and generates first and second output signals having an enhanced phase difference, wherein the comparison section comprises first to $N^{th}$ comparators, each being configured to receive first and second output signals from a corresponding phase-difference enhancer, to compare a phase difference between the first and second output signals with the reference delay time τ, and to output a comparison signal.

2. The time-to-digital converter according to claim 1, wherein the first comparator receives the first and second output signals of the first phase-difference enhancer, compares the phase difference between the first and second output signals of the first phase-difference enhancer with the reference delay time τ, and outputs a first comparison signal; and the $N^{th}$ comparator receives the first and second output signals of the $N^{th}$ phase-difference enhancer, compares the phase difference between the first and second output signals of the $N^{th}$ phase-difference enhancer with the reference delay time τ, and outputs an $N^{th}$ comparison signal.

3. The time-to-digital converter according to claim 2, wherein the first comparator comprises:

a first delay element configured to receive the first output signal of the first phase-difference enhancer, and to output a first delay signal obtained by delaying the first output signal of the first phase-difference enhancer by the reference delay time τ;

a second delay element configured to receive the second output signal of the first phase-difference enhancer, and to output a second delay signal obtained by delaying the second output signal of the first phase-difference enhancer by the reference delay time τ;

a first D flip-flop configured to latch and output the second output signal in response to the first delay signal;

a second D flip-flop configured to latch and output the first output signal in response to the second delay signal; and a NAND gate configured to perform a NOT-AND operation on an output of the first D flip-flop and an output of the second D flip-flop, and to output a comparison signal, wherein the first to $N^{th}$ comparators have an identical structure.

4. The time-to-digital converter according to claim 2, wherein each of the first to $N^{th}$ comparison signals has a value of "1" (logical high) when a phase difference between input signals is greater than the reference delay time τ, and has a value of "0" (logical low) when a phase difference between input signals is equal to or less than the reference delay time τ.

5. The time-to-digital converter according to claim 4, further comprising an XOR gate section configured to receive the first to $N^{th}$ comparison signals and "0" (logical low) applied from an exterior and to perform an exclusive-OR operation on the received first to $N^{th}$ comparison signals and "0."

6. The time-to-digital converter according to claim 5, wherein the XOR gate section comprises first to $N^{th}$ XOR gates, wherein the first XOR gate is configured to receive the first comparison signal and the "0" (logical low) applied from the exterior, and to perform an exclusive-OR operation on the received first comparison signal and "0", and wherein the $N^{th}$ XOR gate is configured to receive the $(N-1)^{th}$ comparison signal and the $N^{th}$ comparison signal, and to perform an exclusive-OR operation on the received $(N-1)^{th}$ comparison signal and the $N^{th}$ comparison signal.

7. The time-to-digital converter according to claim 1, wherein each of the first to Nth phase-difference enhancers doubles a phase difference between signals input to that phase-difference enhancer.

* * * * *